US009772624B2

(12) United States Patent
Takenaga et al.

(10) Patent No.: US 9,772,624 B2
(45) Date of Patent: Sep. 26, 2017

(54) CONTROL APPARATUS, SUBSTRATE PROCESSING APPARATUS, AND SUBSTRATE PROCESSING SYSTEM (71) Applicant: Tokyo Electron Limited, Tokyo (JP)

(72) Inventors: Yuichi Takenaga, Iwate (JP); Takanori Saito, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 287 days.

(21) Appl. No.: 14/645,613

(22) Filed: Mar. 12, 2015

(65) Prior Publication Data
US 2015/0261212 A1 Sep. 17, 2015

(30) Foreign Application Priority Data

Mar. 13, 2014 (JP) ................. 2014-050318

(51) Int. Cl.
G05B 19/418 (2006.01)
H01L 21/67 (2006.01)
(52) U.S. Cl.
CPC ......... G05B 19/41865 (2013.01); G05B 2219/45032 (2013.01); H01L 21/67253 (2013.01); Y02P 90/04 (2015.11); Y02P 90/20 (2015.11)
(58) Field of Classification Search
CPC .... G05B 19/41865; G05B 2219/45032; Y02P 90/04; Y02P 90/20; H01L 21/67253
See application file for complete search history.

(56) References Cited

U.S. PATENT DOCUMENTS

| 7,210,246 B2* | 5/2007 | van der Me | B25J 9/042 |
| | | | 34/403 |
| 8,664,013 B2* | 3/2014 | Takenaga | H01L 22/12 |
| | | | 118/696 |
| 2007/0282475 A1* | 12/2007 | Schmidt | G05B 19/41865 |
| | | | 700/99 |
| 2008/0086228 A1* | 4/2008 | Yamaji | H01L 21/67005 |
| | | | 700/109 |
| 2009/0110824 A1* | 4/2009 | Takenaga | C23C 16/52 |
| | | | 427/248.1 |
| 2014/0335693 A1* | 11/2014 | Takenaga | H01L 21/6708 |
| | | | 438/694 |
| 2015/0270183 A1* | 9/2015 | Takenaga | H01L 22/20 |
| | | | 702/81 |

* cited by examiner

Primary Examiner — Ramesh Patel
(74) Attorney, Agent, or Firm — Abelman, Frayne & Schwab

(57) ABSTRACT

A control apparatus is configured to control an operation of a substrate processing apparatus configured to place at least a monitor substrate therein. The control apparatus controls the operation of the substrate processing apparatus based on a difference between a processing result of the monitor substrate processed by the substrate processing apparatus and a predictive result so as to optimize the monitor substrate loading frequency.

6 Claims, 5 Drawing Sheets

CONTROL APPARATUS, SUBSTRATE PROCESSING APPARATUS, AND SUBSTRATE PROCESSING SYSTEM

CROSS-REFERENCE TO RELATED APPLICATIONS

This application is based on and claims priority from Japanese Patent Application No. 2014-050318, filed on Mar. 13, 2014, with the Japan Patent Office, the disclosure of which is incorporated herein in its entirety by reference.

TECHNICAL FIELD

The present disclosure relates to a control apparatus, a substrate processing apparatus and a substrate processing system.

BACKGROUND

In manufacturing semiconductor devices, a vertical substrate processing apparatus is used to perform collectively a batch-type processing on a plurality of substrates to be processed, e.g., semiconductor wafers ("wafers"). Here, the plurality of wafers is held by a holder called a wafer boat in a shelf form, and the wafer boat is carried into the substrate processing apparatus so as to perform various processings.

The processing of wafers using such a substrate processing apparatus is performed based on a processing recipe (set values of processing parameters) including processing conditions such as, for example, a heater setting temperature, a gas flow rate, and a setting pressure. Specifically, a batch processing is performed in a state where a sheet of an adjustment wafer (a monitor wafer) is loaded in the wafer boat along with a plurality of sheets of product wafers at every predetermined run (processing), the processing recipe is adjusted based on a processing result of the monitor wafer and a desired processing result, and then a next batch processing is performed.

SUMMARY

According to an aspect, the present disclosure provides a control apparatus for controlling an operation of a substrate processing apparatus configured to place at least a monitor substrate therein. The control apparatus controls the operation of the substrate processing apparatus based on a difference between a processing result of the monitor substrate processed by the substrate processing apparatus and a predictive result so as to optimize a frequency of loading the monitor substrate ("monitor substrate loading frequency").

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In order to control the processing result of wafers at a high accuracy, it is preferable to optimize the processing recipe by increasing the monitor wafer loading frequency. However, when the monitor wafer is loaded at, for example, every run, a manufacturing cost is largely increased.

In order to solve the problem described above, there is provided a control apparatus capable of optimizing the monitor wafer loading frequency.

An aspect of the present disclosure provides a control apparatus for controlling an operation of a substrate processing apparatus configured to place at least a monitor substrate therein. The control apparatus controls an operation of the substrate processing apparatus based on a difference between a processing result of the monitor substrate processed by the substrate processing apparatus and a predictive result so as to optimize a monitor substrate loading frequency.

When the difference between the processing result of the monitor substrate processed by the substrate processing apparatus and the predictive result is within a first allowable range, the control apparatus controls the operation of the substrate processing apparatus such that the monitor substrate loading frequency becomes a first frequency. When the difference between the processing result of the monitor substrate processed by the substrate processing apparatus and the predictive result exceeds the first allowable range, the control apparatus controls the operation of the substrate processing apparatus such the monitor substrate loading frequency becomes a second frequency higher than the first frequency.

When the difference between the processing result of the monitor substrate processed by the substrate processing apparatus and the predictive result is within a second allowable range, the control apparatus controls the operation of the substrate processing apparatus such that the monitor substrate loading frequency becomes a third frequency. When the difference between the processing result of the monitor substrate processed by the substrate processing apparatus and the predictive result exceeds the second allowable range, and is within a third allowable range wider than the second allowable range, the control apparatus controls the operation of the substrate processing apparatus such that the monitor substrate loading frequency becomes a fourth frequency higher than the third frequency. When the difference between the processing result of the monitor substrate processed by the substrate processing apparatus and the predictive result exceeds the third allowable range, the control apparatus controls the operation of the substrate processing apparatus such that the monitor substrate loading frequency becomes a fifth frequency higher than the fourth frequency.

The control apparatus controls the operation of the substrate processing apparatus based on a difference between the processing result of the monitor substrate processed by the substrate processing apparatus and a desired result so as to optimize a processing recipe of a substrate.

The control apparatus controls the operation of the substrate processing apparatus so as to optimize the processing recipe when the difference between the processing result of the monitor substrate processed by the substrate processing apparatus and the desired result exceeds a fourth allowable range.

Another aspect of the present disclosure provides a substrate processing apparatus configured to place at least a monitor substrate therein and including a control unit. The control unit controls an operation of the substrate processing apparatus based on a difference between a processing result of the monitor substrate processed by the substrate processing apparatus and a predictive result so as to optimize a monitor substrate loading frequency.

Still another aspect of the present disclosure provides a substrate processing system including: a substrate processing apparatus configured to place at least a monitor substrate therein; a control apparatus configured to control an operation of the substrate processing apparatus; a measuring device configured to measure a processing result of a substrate processed by the substrate processing apparatus; and a processing result predicting device configured to predict a processing result of a substrate to be subsequently processed. The substrate processing apparatus, the control apparatus, the measuring device, and the processing result predicting device are connected through a network. The control apparatus controls the operation of the substrate processing apparatus based on a difference between a processing result of the monitor substrate processed by the substrate processing apparatus, which is obtained using the measuring device, and a predictive result, which is obtained using the processing result predicting device, so as to optimize a monitor substrate loading frequency.

According to the present disclosure, there is provided a control apparatus capable of optimizing the monitor wafer loading frequency.

Hereinafter, exemplary embodiments of the present disclosure will be described with reference to the accompanying drawings. In the present specification and drawings, some elements having substantially the same function and the same configuration are given the same reference numerals, and redundant descriptions thereof will be omitted.

(Exemplary Configuration of Substrate Processing Apparatus)

First, a substrate processing apparatus according to the present exemplary embodiment will be described. In the present specification, a batch-type vertical heat processing apparatus configured to perform a film forming processing on a plurality of substrates to be processed, e.g., semiconductor wafers ("wafers") at once will be described with reference to drawings as an example.

Figure 1:
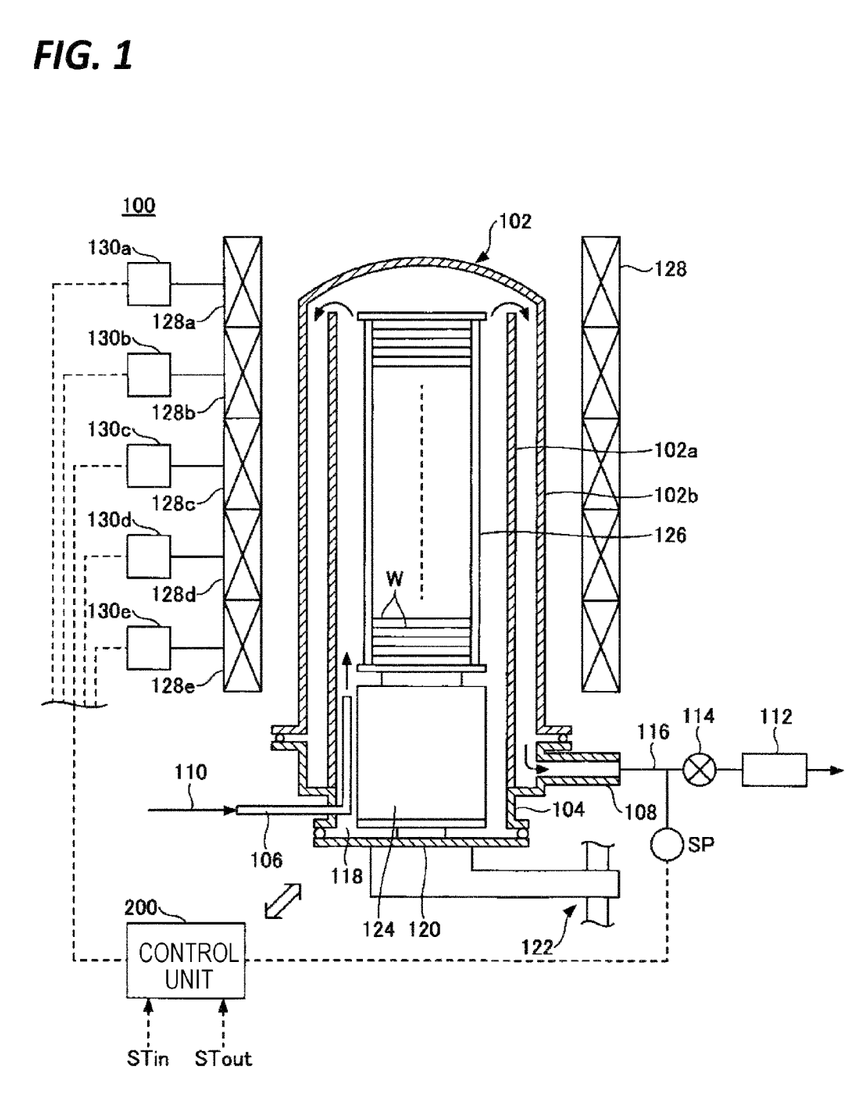
FIG. 1 is a schematic configuration view of an exemplary substrate processing apparatus according to an exemplary embodiment.

FIG. 1 illustrates a schematic configuration view of an exemplary substrate processing apparatus according to the present exemplary embodiment.

A substrate processing apparatus 100 according to the present exemplary embodiment includes a processing container 102 which extends in a vertical direction and is made of, for example, quartz. The processing container 102 is configured in a double-tube structure that includes, for example, a cylindrical inner tube 102a, and an outer tube 102b with a ceiling which is concentrically disposed outside the inner tube 102a.

The lower end portion of the processing container 102 is hermetically maintained by a manifold 104 made of, for example, stainless steel. The manifold 104 may be fixed to a base plate (not illustrated).

The manifold 104 includes a gas introducing unit 106 configured to introduce a processing gas or a purge gas such as, for example, an inert gas (e.g., $N_2$ gas) into the processing container 102, and a gas exhaust unit 108 configured to evacuate the inside of the processing container 102. Although one gas introducing unit 106 is provided in the configuration illustrated in FIG. 1, the present disclosure is not limited thereto. The manifold 104 may have a configuration that includes a plurality of gas introducing units 106 according to, for example, the number of gas species to be used.

The kind of the processing gas is not particularly limited, but may be properly selected by a person ordinarily skilled in the art according to, for example, the kind of a film to be formed.

A pipe 110 is connected to the gas introducing unit 106 so as to introduce the various kinds of gases described above. For example, flow rate control units (not illustrated), such as, for example, a mass flow controller and a valve (not illustrated), are interposed in the pipe 110 so as to individually control a gas flow rate.

The gas exhaust unit 108 is connected to a pipe 116 serving as a vacuum exhaust path which includes, for example, a vacuum pump 112 configured to control the inside of the processing container 102 at a reduced pressure, and an opening degree variable valve 114. The pipe 116 is provided with a pressure sensor SP configured to detect the pressure within the processing container 102 and to perform a feedback control of the opening degree variable valve 114.

A furnace opening 118 is formed in the lower end portion of the manifold 104, and is provided with a disk-shaped cover 120 made of, for example, stainless steel. The cover 120 is provided to be movable up and down by an elevating mechanism 122, and to be capable of sealing the furnace opening 118.

A heat insulating cylinder 124 made of, for example, quartz is provided above the cover 120. A wafer boat 126 made of, for example, quartz is mounted on the heat insulating cylinder 124. In the wafer boat 126, for example, 25 to 150 wafers W are horizontally held at predetermined intervals in multi stages.

The wafer boat 126 is carried into the processing container 102 by moving the cover 120 upwards by using the elevating mechanism 122, and is carried out of the inside of the processing container 102 to a loading area at the lower side by moving the cover 120 downwards after a film forming processing.

On the outer periphery of the processing container 102, for example, a cylindrical heater 128 is provided to perform a heat control of the processing container 102 to a predetermined temperature.

The heater 128 is divided into a plurality of zones, e.g., five zones (FIG. 1 illustrates an example in which the heater is divided into, but not exclusively, five zones of zone 1, zone 2, zone 3, zone 4 and zone 5 from the top side in the vertical direction). Heaters 128a to 128e are configured to independently control heat generation amounts by power controllers 130a to 130e, respectively.

On the inner wall of the inner tube 102a and the outer wall of the outer tube 102b, inner and outer temperature sensors STin and STout are provided to correspond to the heaters 128a to 128e, respectively. Each of the inner and outer temperature sensors STin and STout is constituted by, for example, a thermocouple. The inner temperature sensors STin are covered with, for example, a pipe made of quartz, in order to suppress metal contamination of wafers W.

All the wafers W placed in the wafer boat 126 constitute one batch, and are subjected to a heat treatment at the same time. At least one of the wafers W placed in the wafer boat 126 is a monitor wafer which is placed, based on the substrate processing method of the present exemplary embodiment to be described later. The monitor wafer is a wafer used for determining whether a desired substrate processing has been performed on the wafers W (in particular, product wafers). Based on the processing result of the monitor wafer, for example, an adjustment of a processing condition in the following run is performed. The monitor wafer may be preferably placed in each of zones of the heater 128. When the heater 128 is divided into five zones, for example, one or two monitor wafers W may be disposed in each zone.

The substrate processing apparatus 100 includes a control unit 200 configured to perform a process control based on processing recipe data which includes processing conditions such as, for example, a heater setting temperature, a setting pressure, and a gas flow rate according to, for example, the kind of a thin film to be formed, and the film thickness. The control unit 200 receives temperature detection signals from the inner temperature sensors STin and the outer temperature sensors STout, and receives a pressure detection signal from the pressure sensor SP. Then, for example, the power controllers 130a to 130e of the heater 128, the opening degree variable valve 114, and the flow rate control unit are controlled based on the detection signals.

Figure 2:
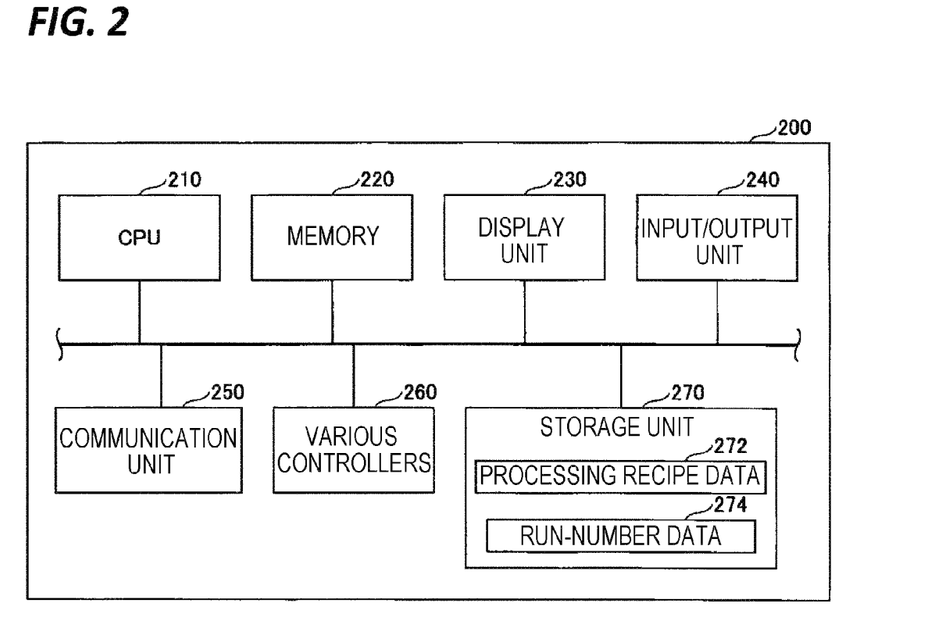
FIG. 2 is a block diagram illustrating an exemplary configuration of a control unit according to the exemplary embodiment.

FIG. 2 illustrates a block diagram illustrating an exemplary configuration of a control unit according to the present exemplary embodiment. As illustrated in FIG. 2, the control unit 200 includes a central processing unit (CPU) 210, a memory 220 used for various processings performed by the CPU 210, a display unit 230 including, for example, a liquid crystal display for displaying, for example, an operation screen or a selection screen, an input/output unit 240 including, for example, an operation panel or a keyboard through which an operator performs various operations such as, for example, inputting of various data and outputting of various data to a predetermined storage medium, and a communication unit 250 used for sending/receiving data via, for example, a network.

The control unit 200 includes, for example, various controllers 260 configured to control respective units of the substrate processing apparatus 100, and a storage unit 270 including, for example, a hard disk (HDD) configured to store various programs executed by the CPU 210 or data required for executing the programs. The CPU 210 reads out the programs or the data from the storage unit 270 and uses them, as necessary.

The various controllers 260 may include, for example, a temperature controller configured to control, for example, the power controllers 130a to 130e according to a command from the substrate processing apparatus 100 to control the heater 128, and a pressure controller configured to control the pressure within the processing container 102.

The storage unit 270 stores, for example, processing recipe data (processing condition data) 272 and run-number data 274. The processing recipe data 272 include a plurality of processing recipes including processing conditions such as, for example, a setting pressure, a heater setting temperature, and a gas flow rate according to, for example, the kind of a thin film to be formed, and the film thickness. The run-number data 274 indicate the number of substrate processing processes (the number of runs) which have been sequentially performed in a state where no monitor wafer has been loaded.

The substrate processing apparatus 100 according to the present exemplary embodiment reads out a corresponding processing recipe according to, for example, the kind of a thin film to be formed, and the film thickness from the processing recipe data 272, and executes a film forming processing on the wafers W based on the processing recipe. The substrate processing apparatus 100 is configured such that, when the number of substrate processing processes (hereinafter, referred to as a count value) which have been sequentially performed in a state where no monitor wafer has been loaded is a predetermined count setting value, monitor wafers W are loaded in the wafer boat 126.

(Exemplary Configuration of Substrate Processing System)

Hereinafter, an exemplary substrate processing system according to the present exemplary embodiment will be described.

Figure 3:
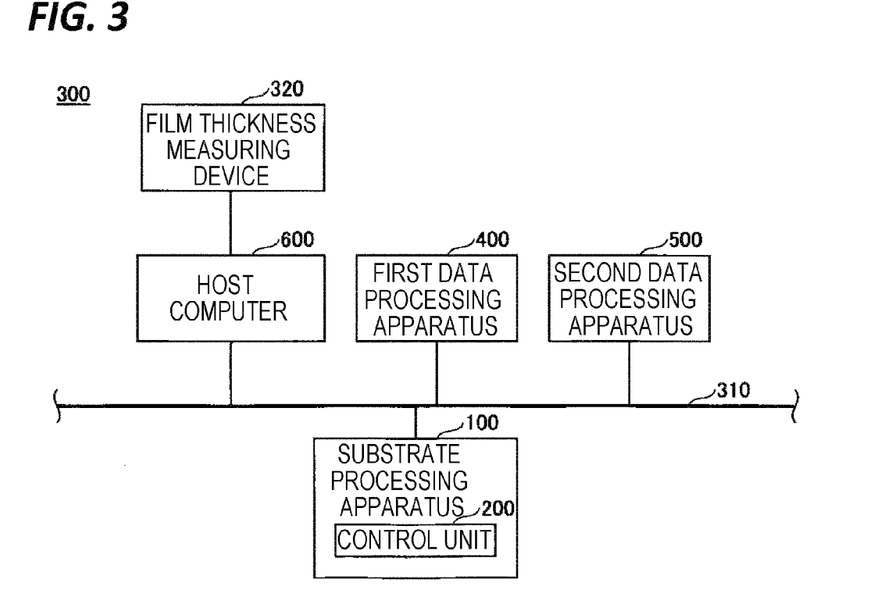
FIG. 3 is a block diagram illustrating an exemplary configuration of a substrate processing system according to the exemplary embodiment.

FIG. 3 illustrates a block diagram illustrating an exemplary configuration of the substrate processing system according to the present exemplary embodiment. As illustrated in FIG. 3, a substrate processing system 300 according to the present exemplary embodiment includes the above-described substrate processing apparatus 100 according to the present exemplary embodiment, a first data processing apparatus 400, a second data processing apparatus 500, and a host computer 600 (a control apparatus in the claims) which are connected through a well-known network 310 such as, for example, a local area network (LAN).

The first data processing apparatus 400 is configured to optimize the processing recipe when the result of the processing processed by the substrate processing apparatus 100 (e.g., the film thickness) is out of the predictive processing result (e.g., the predictive film thickness) calculated by the second data processing apparatus 500, and the deviation exceeds a predetermined value. In another exemplary embodiment, the first data processing apparatus 400 may be configured such that when the result of the processing processed by the substrate processing apparatus 100 (e.g., the film thickness) is out of the predictive processing result (e.g., the predictive film thickness) calculated by the second data processing apparatus 500, the processing recipe is optimized regardless of the extent of the deviation.

Figure 4:
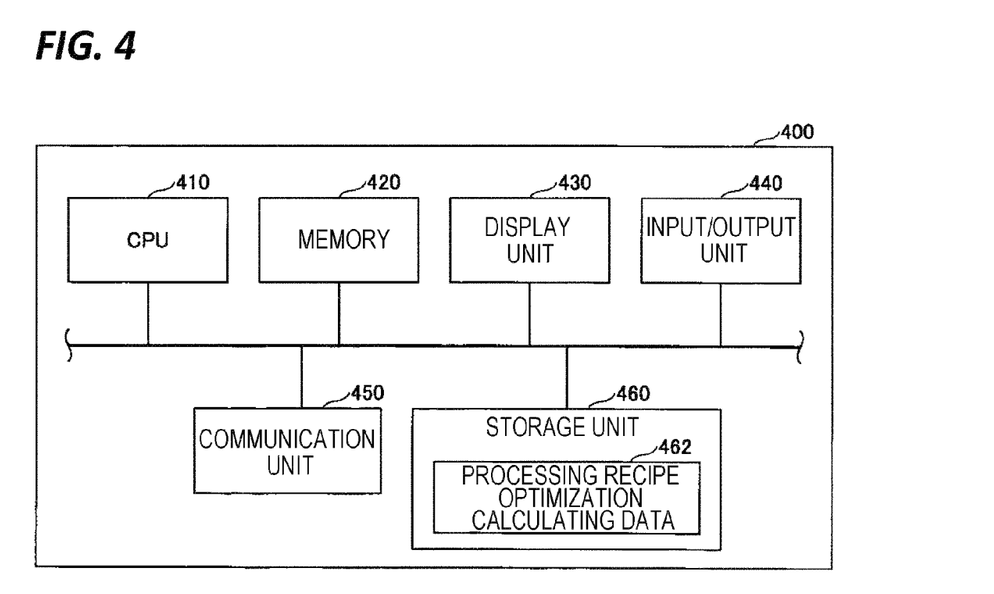
FIG. 4 is a block diagram illustrating an exemplary configuration of a first data processing apparatus according to the exemplary embodiment.

FIG. 4 illustrates a block diagram illustrating an exemplary configuration of the first data processing apparatus according to the present exemplary embodiment. As illustrated in FIG. 4, the first data processing apparatus 400 includes, for example, a central processing unit (CPU) 410, a memory 420 used for various data processings performed by the CPU 410, a display unit 430 including, for example, a liquid crystal display for displaying, for example, an operation screen or a selection screen, an input/output unit 440 including, for example, an operation panel or a keyboard through which an operator performs, for example, inputting of various data and outputting of various data to a predetermined storage medium, a communication unit 450 used for sending/receiving data to/from, for example, the substrate processing apparatus 100 via the network 310, and a storage unit 460 including, for example, a hard disk (HDD) configured to store, for example, various programs executed by the CPU 410 or data required for executing the programs. The CPU 410 reads out the programs or the data as described above from the storage unit 460 and uses them, as necessary. The first data processing apparatus 400 may be constituted by, for example, a computer.

The storage unit 460 stores, for example, processing recipe optimization calculating data 462 for calculating an optimum processing recipe based on, for example, film thickness data and processing recipe data. As for the processing recipe optimization calculating data, for example, a film thickness temperature coefficient indicating the relationship between a temperature and a film thickness is stored when processing recipe data are, for example, temperature recipe data.

The second data processing apparatus 500 is configured to calculate (predict) a processing result in the following run based on a plurality of results of processings performed by the substrate processing apparatus 100 in advance (e.g., film thicknesses).

Figure 5:
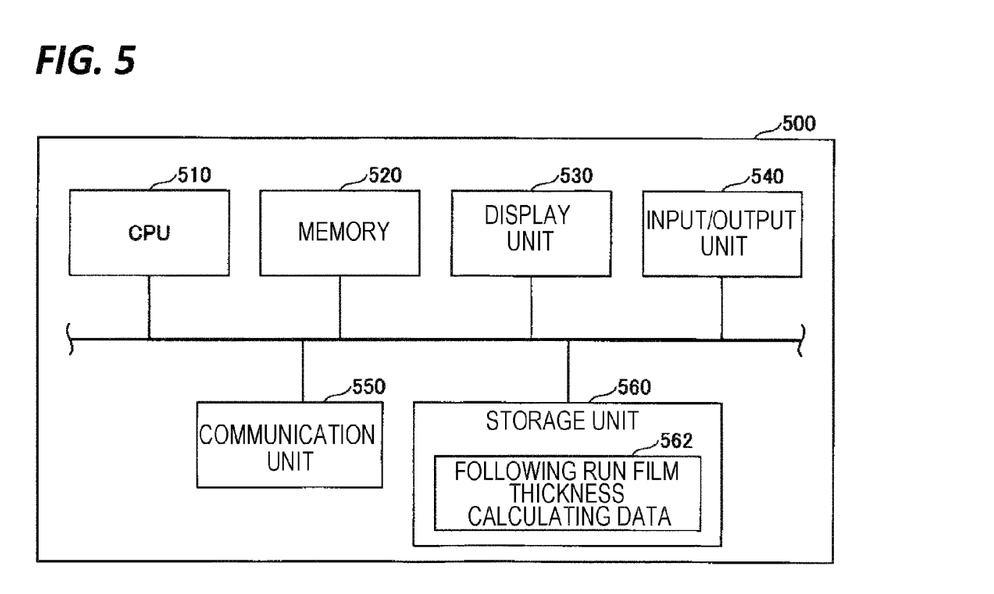
FIG. 5 is a block diagram illustrating an exemplary configuration of a second data processing apparatus according to the exemplary embodiment.

FIG. 5 illustrates a block diagram illustrating an exemplary configuration of the second data processing apparatus according to the present exemplary embodiment. As illustrated in FIG. 5, the second data processing apparatus 500 includes, for example, a central processing unit (CPU) 510, a memory 520 used for various data processings performed by the CPU 510, a display unit 530 including, for example, a liquid crystal display for displaying, for example, an operation screen or a selection screen, an input/output unit 540 including, for example, an operation panel or a keyboard through which an operator performs, for example, inputting of various data and outputting of various data to a predetermined storage medium, a communication unit 550 used for sending/receiving data to/from, for example, the substrate processing apparatus 100 via the network 310, and a storage unit 560 including, for example, a hard disk (HDD) configured to store, for example, various programs executed by the CPU 510 or data required for executing the programs.

The storage unit 560 stores, for example, following run film thickness calculating data for predicting the processing result in the following run based on processing results of wafers in a plurality of processing cycles including substrate processing processes performed by the substrate processing apparatus 100 in advance, and a subsequent maintenance of the substrate processing apparatus 100. For example, in a process where a film thickness is varied by an accumulated film thickness within the processing container 102, a film thickness in the following run (that is, a predictive film thickness in the following run) may be calculated (predicted) from the accumulated film thickness. The film thickness in the following run may be calculated (predicted) based on the signals of the power controllers 130a to 130e, the opening degree variable valve 114, and/or the flow rate control unit, for example.

Figure 6:
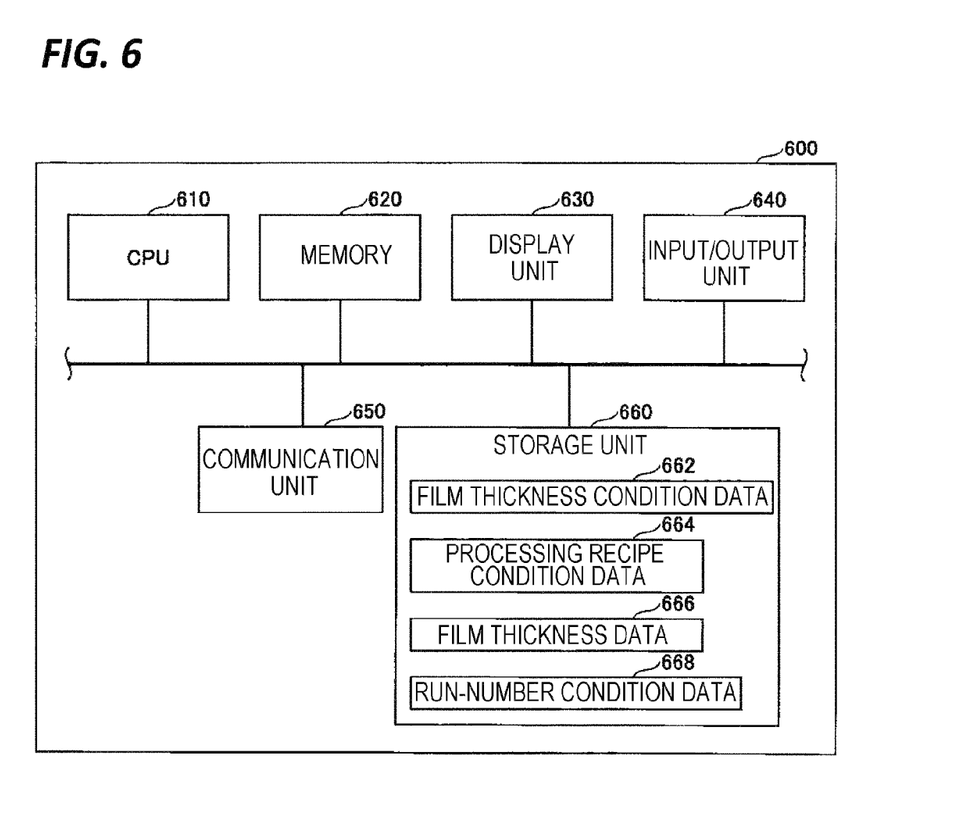
FIG. 6 is a block diagram illustrating an exemplary configuration of a host computer according to the exemplary embodiment.

FIG. 6 illustrates a block diagram illustrating an exemplary configuration of the host computer according to the present exemplary embodiment. As illustrated in FIG. 6, the host computer 600 includes, for example, a central processing unit (CPU) 610, a memory 620 used for various data processings performed by the CPU 610, a display unit 630 including, for example, a liquid crystal display for display-ing, for example, an operation screen or a selection screen, an input/output unit 640 including, for example, a keyboard through which an operator performs, for example, inputting of various data and outputting of various data to a predetermined storage medium, and a communication unit 650 used for sending/receiving data to/from, for example, the substrate processing apparatus 100 via the network 310.

The communication unit 650 is connected to the communication unit 250 within the control unit 200 in the substrate processing apparatus 100 via the network 310. The communication unit 250 of the substrate processing apparatus 100 may include a logical interface unit such as, for example, a host communication interface (HCI), for the host computer 600, and executes various data exchanges with the host computer 600 through the HCI based on a protocol such as, for example, TCP/IP.

The host computer 600 includes, for example, a storage unit 660 such as, for example, a hard disk (HDD) configured to store, for example, various programs executed by the CPU 610 or data required for executing the programs. The CPU 610 reads out the programs or the data from the storage unit 660 and uses them, as necessary.

The storage unit 660 stores, for example, film thickness condition data 662 including film thickness conditions set in advance such as a predictive film thickness in the following run and its allowable range, processing recipe condition data 664 including, for example, an allowable range of the processing recipe, film thickness data 666 received from a film thickness measuring device 320 to be described later, and run-number condition data 668 including, for example, information corresponding to the monitor wafer loading frequency in the wafer boat 126.

As illustrated in FIG. 3, the host computer 600 is connected to, for example, the film thickness measuring device 320 configured to measure the processing results of wafers processed by the substrate processing apparatus 100 (the film thicknesses in the present exemplary embodiment). In the example illustrated in FIG. 3, the film thickness measuring device 320 is connected to the host computer, but may be connected to the substrate processing apparatus 100. In this case, film thickness data from the film thickness measuring device 320 are received by the substrate processing apparatus 100 and transmitted to the host computer 600 via the network 310.

The film thickness measuring device 320 is configured to measure the film thickness of a thin film of a wafer surface on, for example, a mounting table (not illustrated) provided within the substrate processing apparatus, by, for example, an ellipsometer. The ellipsometer is an optical interference type film thickness gauge including a vertical illumination type microscope, a spectroscope and a data processing unit, and the film thickness may be calculated by irradiating light to a wafer from a light source through an objective lens, causing reflected light to enter the spectroscope, and analyzing reflection spectrum. The film thickness measuring device 320 is configured to measure the film thickness of the thin film formed on the wafer based on the command from the host computer 600, and to transmit the measured film thickness as the film thickness data to the host computer 600.

(Substrate Processing Method according to the Present Exemplary Embodiment)

Hereinafter, descriptions will be made on a wafer processing method using the substrate processing system 300 that includes the substrate processing apparatus 100 according to the present exemplary embodiment.

As described above, a monitor wafer refers to a wafer used for determining whether a desired substrate processing has been performed on wafers W (in particular, product wafers). Based on the processing result of the monitor wafer, for example, an adjustment of a processing condition in the following run is performed.

In order to control the processing result of wafers W at a high accuracy, it is preferable to optimize the processing recipe at a high monitor wafer loading frequency. However, when the monitor wafer is loaded at, for example, every run, a manufacturing cost is largely increased.

Therefore, in the present exemplary embodiment, a change of the monitor wafer loading frequency is performed as necessary based on determination by the host computer 600 after wafers are processed. Specifically, the processing of wafers, the change of the monitor wafer loading frequency, and the optimization of a processing recipe are performed through data exchanges among the host computer 600, the substrate processing apparatus 100, the first data processing apparatus 400 and the second data processing apparatus 500 under the controls by predetermined programs, respectively.

The processing of wafers, the change of the monitor wafer loading frequency, and the optimization of the processing recipe according to the present exemplary embodiment will be described in detail with reference to drawings. In the present exemplary embodiment, the number of substrate processing processes sequentially performed in a state where the monitor wafer is not loaded is counted. When the count value is a predetermined count setting value, the monitor wafer W is loaded in the wafer boat 126. In the exemplary embodiment to be described later, based on a measured film thickness in a case where a monitor wafer is loaded and a predictive film thickness, when a difference between these thicknesses exceeds a predetermined value, the count setting value described above is varied, thereby varying a loading interval of the monitor wafer, but the present disclosure is not limited thereto.

Figure 7:
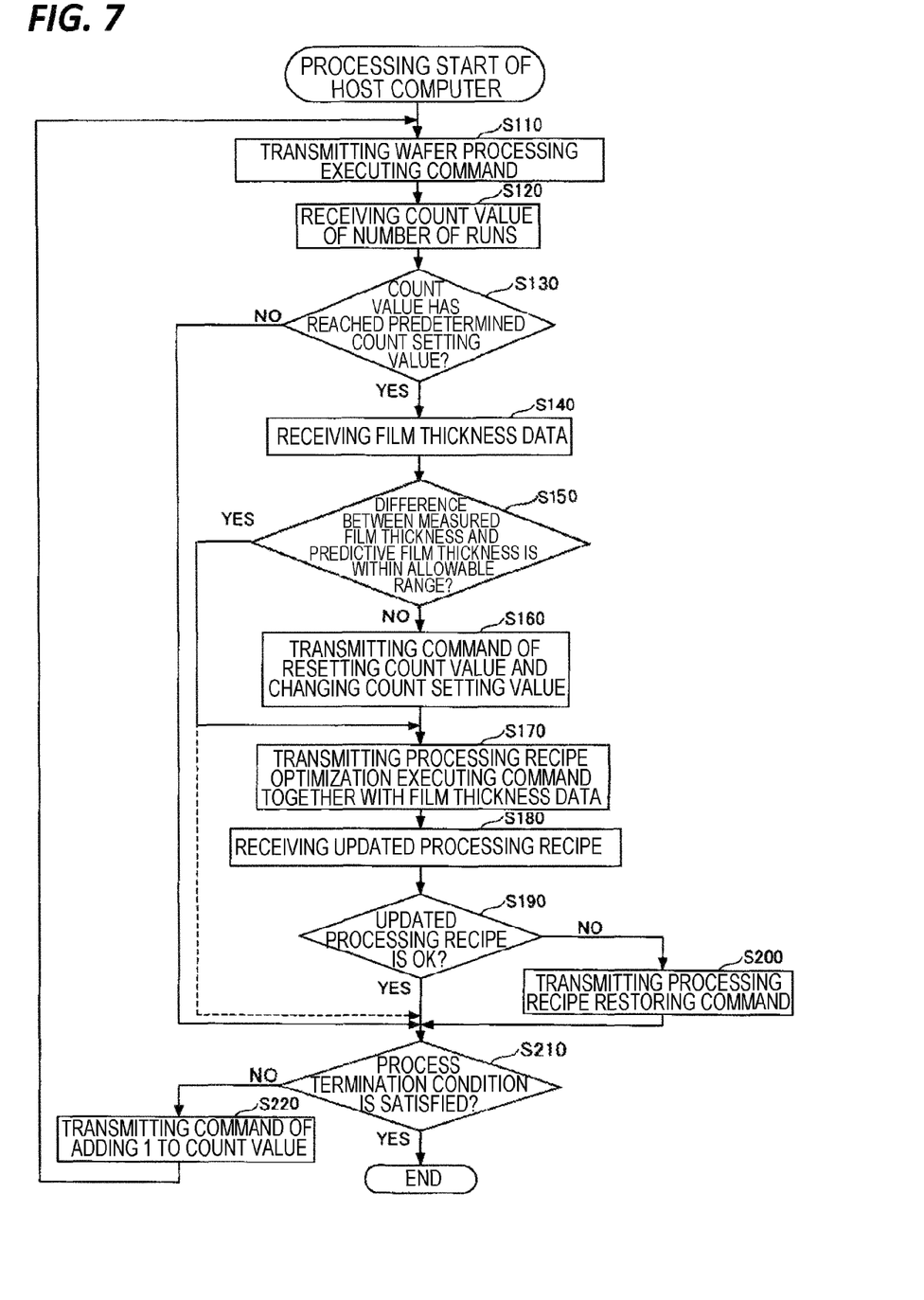
FIG. 7 is a flow chart illustrating an exemplary substrate processing method performed by the host computer according to the exemplary embodiment.

FIG. 7 illustrates a flow chart illustrating an exemplary substrate processing method performed by the host computer according to the present exemplary embodiment. A processing on wafers by the substrate processing system 300 according to the present exemplary embodiment is executed based on various commands from the host computer 600.

First, as illustrated in FIG. 7, a wafer processing executing command is transmitted to the substrate processing apparatus 100 in step S110.

According to the wafer processing executing command, the substrate processing apparatus 100 executes a processing of wafers based on processing conditions (e.g., a setting pressure within a processing container, a heater setting temperature, and a gas flow rate) of the processing recipe data 272 stored in the storage unit 270.

Hereafter, descriptions will be made on the operation of the substrate processing apparatus 100 when a film forming processing of wafers is executed. The wafer boat 126 is carried into the processing container 102, in which non-processed wafers accommodated in, for example, a sealed container (FOUP) are conveyed to the wafer boat 126. The inside of the processing container 102 is controlled to be in a setting pressure, and the heater 128 is controlled based on a setting temperature so as to increase the temperature within the processing container 102 to a processing temperature. Then, the predetermined processing gas is supplied into the processing container 102 so as to perform a film forming processing on the wafers.

When the film forming processing is completed, the inside of the processing container 102 is cooled to a predetermined temperature under an inert gas atmosphere, and the wafer boat 126 is carried out from the inside of the processing container 102. Then, the processed wafers are carried out of the wafer boat 126 to be returned to the FOUP.

In step S120, the host computer 600 receives the count value of the number of runs stored in the storage unit 270 of the substrate processing apparatus 100. In the present exemplary embodiment, according to the count value determined in advance, a monitor wafer is set to be placed in the wafer boat 126. In step S160 to be described later, when the count setting value of the number of runs is changed, the monitor wafer loading frequency in the wafer boat 126 may be changed. That is, in the present exemplary embodiment, the run-number condition data 668 described above include the count setting value of the number of runs.

Specifically, in step S130, when it is determined that the number of runs received in step S120 has not reached a predetermined count setting value (that is, the monitor wafer is not placed on the wafer boat 126), in step S210 to be described later, it is determined whether a process termination condition is satisfied. The process termination condition may include, for example, the number of sequentially executed film forming processings, a time, and an occurrence of abnormality in the substrate processing apparatus 100.

In step S130, when it is determined that the number of runs received in step S120 has reached the predetermined count setting value (that is, the monitor wafer is placed on the wafer boat 126), the FOUP accommodating the processed wafers is conveyed to the film thickness measuring device 320 by, for example, an automatic conveyance robot (not illustrated). In the film thickness measuring device 320, the film thickness of the thin film formed on the monitor wafer is measured, and the measured film thickness is transmitted to the host computer 600, as film thickness data.

In step S140, when the film thickness data of the monitor wafer is received from the film thickness measuring device 320, the host computer 600 obtains a difference between the measured film thickness from the film thickness data and the predictive film thickness, and determines whether the difference is within an allowable range in step S150.

In step S150, when it is determined that the difference between the measured film thickness and the predictive film thickness is within the allowable range, in step S210 to be described later, it is determined whether a process termination condition is satisfied (while the count setting value is not changed).

In step S150, when it is determined that the difference between the measured film thickness and the predictive film thickness exceeds the allowable range, the count value of the number of runs is reset and the count setting value is changed in step S160. That is, in step S160, the host computer 600 transmits a reset command of the run-number data 274 to the substrate processing apparatus 100 so as to change the run-number condition data 668.

A change of the run-number condition data 668 is performed such that, for example, when an absolute value of the difference between the measured film thickness and the predictive film thickness is within a first allowable range (a first threshold value), the count setting value of the number of runs becomes 15, that is, a loading interval of the monitor wafer into the wafer boat 126 becomes once per 15 runs (first frequency). Otherwise, when a current count setting value is 15, the count setting value is maintained.

The change is performed such that when an absolute value of the difference between the measured film thickness and the predictive film thickness exceeds the first allowable range, the count setting value of the number of runs becomes, for example, 2, that is, a loading interval of the monitor wafer into the wafer boat 126 becomes once per 2 runs (second frequency). However, the count setting value is merely an example, and other values may be employed.

In the exemplary embodiment described above, one allowable range is used to change the run-number condition data 668, but two or more allowable ranges may be used to change the run-number condition data 668. For example, in a case where a second allowable range, and a third allowable range wider than the second allowable range are used, when an absolute value of the difference between the measured film thickness and the predictive film thickness is within the second allowable range, the run-number condition data 668 are changed so that the count setting value of the number of runs becomes, for example, 15. When an absolute value of the difference between the measured film thickness and the predictive film thickness exceeds the second allowable range, and is within the third allowable range wider than the second allowable range, the run-number condition data 668 are changed so that the count setting value of the number of runs becomes, for example, 2. When an absolute value of the difference between the measured film thickness and the predictive film thickness exceeds the third allowable range, the run-number condition data 668 are changed so that the count setting value of the number of runs becomes, for example, 1, that is, the monitor wafer is loaded once per run.

Then, in step S170, the host computer 600 transmits a processing recipe optimization executing command to the substrate processing apparatus 100. When receiving the processing recipe optimization executing command together with the film thickness data from the host computer 600 in step S170, the substrate processing apparatus 100 transmits the film thickness data and processing recipe data as data required for calculation to the first data processing apparatus 400, and transmits a processing recipe optimization calculating command to the first data processing apparatus 400.

According to the processing recipe optimization calculating command, the first data processing apparatus 400 executes a processing recipe optimization calculation by a method well-known to the person skilled in the art.

When a film forming processing for forming a thin film on the wafers is continuously and repeatedly executed through the same processing recipe by the substrate processing apparatus 100, the processing result (e.g., a film thickness) tends to be changed with elapse of time. This is because, for example, a characteristic of the substrate processing apparatus 100 is deteriorated, or the state within the processing container 102 is changed. The state of the substrate processing apparatus 100 may be changed in a shift manner due to maintenance of the substrate processing apparatus 100. Therefore, even if a film forming processing for forming a thin film on the wafers is continuously and repeatedly executed through the same processing recipe, a difference occurs between the film thickness (the measured film thickness) of the thin film formed on the wafers and the predictive film thickness. Therefore, when it is determined that the difference between the measured film thickness and the predictive film thickness exceeds the allowable range, it is preferable to optimize the processing recipe. However, the optimization of the processing recipe is not limited to the above described exemplary embodiment performed based on the allowable range. For example, when a monitor wafer is loaded, an optimization of the processing recipe may be necessarily performed.

The first data processing apparatus 400 transmits the processing recipe obtained through the processing recipe optimization calculation to the substrate processing apparatus 100. The substrate processing apparatus 100 receives the processing recipe calculated by the first data processing apparatus 400, updates a current processing recipe by replacing the current processing recipe with the calculated processing recipe, and transmits the updated processing recipe to the host computer 600.

When receiving the updated processing recipe from the substrate processing apparatus 100 in step S180, the host computer 600 determines, in step S190, whether the updated processing recipe is OK. For example, it is determined whether the processing condition (such as a setting temperature) constituting the updated processing recipe is within the allowable range.

In step S190, when the updated processing recipe is determined as OK, it is determined whether a process termination condition is satisfied in step S210. Meanwhile, in step S190, when the updated processing recipe is determined as not OK, in step S200, the host computer 600 transmits a processing recipe restoring command to the substrate processing apparatus 100.

When receiving the processing recipe restoring command, the substrate processing apparatus 100 executes a processing recipe restoration. That is, the updated processing recipe is discarded, and a pre-update processing recipe is restored. Accordingly, the processing of the following wafers is executed based on the pre-update processing recipe.

In S170 to S200 described above with reference to FIG. 7, the processing recipe optimization is executed at each run. However, as indicated by dashed line in FIG. 7, the processing recipe optimization may be executed only when the difference between the measured film thickness and the predictive film thickness is determined to exceed the allowable range in step S150.

In step S210 following each step, when it is determined that a process termination condition is not satisfied, the host computer 600 transmits a command of adding 1 to the current count value to the substrate processing apparatus 100. The substrate processing apparatus 100 updates the run-number data 274 so that 1 is added to the current count value. The host computer 600 returns to the processing in step S110, and transmits the wafer processing executing command to the substrate processing apparatus 100.

In this manner, the monitor wafer loading frequency may be automatically controlled by the host computer 600, while the processing of wafers may be repeated. In step S210 following each step, when it is determined that the process termination is satisfied, a series of processings is terminated.

In the substrate processing method which includes a change of the monitor wafer loading frequency according to the present exemplary embodiment as described above, the substrate processing apparatus 100 receives the command from the host computer 600, and changes the count setting value of the number of runs corresponding to the monitor wafer loading frequency. Accordingly, the command from the host computer 600 may cause the substrate processing apparatus 100 to execute the change of the monitor wafer loading frequency. In another exemplary embodiment, the change of the count setting value of the number of runs (update of the run-number data 274) may be directly instructed by the host computer 600.

In the substrate processing method according to the present exemplary embodiment, for example, a predictive value in the following processing (e.g., a predictive film thickness value) may also be managed by the host computer 600, and whether or not to execute the change of the monitor wafer loading frequency may be determined by the host computer 600. Accordingly, some conditions such as, for example, a deviation from the predictive film thickness value by which the change of the monitor wafer loading frequency is executed may be freely set and managed by the host computer 600.

According to the automation of the change of the monitor wafer loading frequency as described above, whether or not to change the monitor wafer loading frequency may not be determined by the user, which may reduce the burden on the user. Also, since the monitor wafer loading frequency is optimized, a cost for monitor wafers may be reduced.

Such a change of the monitor wafer loading frequency may be applied to various operations of the substrate processing system 300. For example, the change may be applied to obtain an optimum monitor wafer loading frequency immediately after the substrate processing system 300 is operated or immediately after maintenance of, for example, a component exchange.

In the above described exemplary embodiment, a film forming processing is exemplified as a process treatment of the substrate processing apparatus. Without being limited thereto, however, the present disclosure may be employed in, for example, an oxidation processing, and a diffusion processing. In the description, film thickness data are exemplified as wafer process data obtained as the result of the process treatment, but the present disclosure is not limited thereto. Data which can be measured after the process treatment, such as, for example, a microscopic dimension of a device formed on a wafer through an etching processing, an etching rate, and a wafer in-plane uniformity, may be applied. In this case, instead of the film thickness measuring device 320, a measuring device capable of measuring the applicable process data among the process data is used.

In the above-described exemplary embodiment, the substrate processing method according to the present exemplary embodiment is executed by the host computer 600, but the present disclosure is not limited thereto. For example, the control unit 200 of the substrate processing apparatus 100 may serve as the host computer 600 described above.

In order to achieve the present disclosure, in the substrate processing method according to the exemplary embodiment, a medium such as, for example, a storage medium, in which a program of software for executing the functions of the above described exemplary embodiment is stored, is supplied to a system or a device, and a computer of the system or the device reads out and executes the program stored in the medium such as the storage medium.

In this case, the program read out from the medium such as the storage medium itself, achieves the functions of the above described exemplary embodiment, and the medium such as, for example, the storage medium which stores the program constitutes the present disclosure. As for the medium such as the storage medium for providing the program, a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, a magnetic tape, a nonvolatile memory card, or a ROM may be exemplified. The program may be provided to the medium by being downloaded through a network.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A control apparatus for controlling an operation of a substrate processing apparatus configured to place at least a monitor substrate therein, the control apparatus comprising:
a control unit configured to control an operation of the substrate processing apparatus based on a difference between a processing result of the monitor substrate processed by the substrate processing apparatus and a predictive result so as to optimize a monitor substrate loading frequency,
wherein, when the difference between the processing result of the monitor substrate processed by the substrate processing apparatus and the predictive result is within a first allowable range, the control unit controls the operation of the substrate processing apparatus such that the monitor substrate loading frequency becomes a first frequency, and
when the difference between the processing result of the monitor substrate processed by the substrate processing apparatus and the predictive result exceeds the first allowable range, the control unit controls the operation of the substrate processing apparatus such that the monitor substrate loading frequency becomes a second frequency higher than the first frequency.

2. The control apparatus of claim 1, wherein, when the difference between the processing result of the monitor substrate processed by the substrate processing apparatus and the predictive result is within a second allowable range, the control unit controls the operation of the substrate processing apparatus such that the monitor substrate loading frequency becomes a third frequency,
when the difference between the processing result of the monitor substrate processed by the substrate processing apparatus and the predictive result exceeds the second allowable range, and is within a third allowable range wider than the second allowable range, the control unit controls the operation of the substrate processing apparatus such that the monitor substrate loading frequency becomes a fourth frequency higher than the third frequency, and
when the difference between the processing result of the monitor substrate processed by the substrate processing apparatus and the predictive result exceeds the third allowable range, the control unit controls the operation of the substrate processing apparatus such that the monitor substrate loading frequency becomes a fifth frequency higher than the fourth frequency.

3. The control apparatus of claim 1, wherein the control unit controls the operation of the substrate processing apparatus based on a difference between the processing result of the monitor substrate processed by the substrate processing apparatus and a desired result so as to optimize a processing recipe of a substrate.

4. The control apparatus of claim 3, wherein the control unit controls the operation of the substrate processing apparatus so as to optimize the processing recipe when the difference between the processing result of the monitor substrate processed by the substrate processing apparatus and the desired result exceeds a fourth allowable range.

5. A substrate processing apparatus configured to place at least a monitor substrate therein and including a control unit, wherein the control unit controls an operation of the substrate processing apparatus based on a difference between a processing result of the monitor substrate processed by the substrate processing apparatus and a predictive result so as to optimize a monitor substrate loading frequency, wherein, when the difference between the processing result of the monitor substrate processed by the substrate processing apparatus and the predictive result is within a first allowable range, the control unit controls the operation of the substrate processing apparatus such that the monitor substrate loading frequency becomes a first frequency, and when the difference between the processing result of the monitor substrate processed by the substrate processing apparatus and the predictive result exceeds the first allowable range, the control unit controls the operation of the substrate processing apparatus such the monitor substrate loading frequency becomes a second frequency higher than the first frequency.

6. A substrate processing system comprising:

a substrate processing apparatus configured to place at least a monitor substrate therein;

a control apparatus configured to control an operation of the substrate processing apparatus;

a measuring device configured to measure a processing result of a substrate processed by the substrate processing apparatus; and a processing result predicting device configured to predict a processing result of a substrate to be subsequently processed, wherein the substrate processing apparatus, the control apparatus, the measuring device, and the processing result predicting device are connected through a network, and the control apparatus controls the operation of the substrate processing apparatus based on a difference between a processing result of the monitor substrate processed by the substrate processing apparatus, which is obtained using the measuring device, and a predictive result, which is obtained using the processing result predicting device, so as to optimize a monitor substrate loading frequency, wherein, when the difference between the processing result of the monitor substrate processed by the substrate processing apparatus and the predictive result is within a first allowable range, the control apparatus controls the operation of the substrate processing apparatus such that the monitor substrate loading frequency becomes a first frequency, and when the difference between the processing result of the monitor substrate processed by the substrate processing apparatus and the predictive result exceeds the first allowable range, the control apparatus controls the operation of the substrate processing apparatus such the monitor substrate loading frequency becomes a second frequency higher than the first frequency.

* * * * *